(12) United States Patent
Balakrishnan et al.

(10) Patent No.: US 11,094,819 B2
(45) Date of Patent: Aug. 17, 2021

(54) STACKED VERTICAL TUNNEL FET DEVICES

(71) Applicant: International Business Machines Corporation, Armonk, NY (US)

(72) Inventors: Karthik Balakrishnan, Scarsdale, NY (US); Bahman Hekmatshoartabari, White Plains, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/705,662

(22) Filed: Dec. 6, 2019

(65) Prior Publication Data

US 2021/0175354 A1   Jun. 10, 2021

(51) Int. Cl.
*H01L 29/78*   (2006.01)
*H01L 27/092*   (2006.01)
*H01L 29/10*   (2006.01)
*H01L 21/8238*   (2006.01)
*H01L 29/417*   (2006.01)
(Continued)

(52) U.S. Cl.
CPC .. *H01L 29/7827* (2013.01); *H01L 21/823885* (2013.01); *H01L 27/092* (2013.01); *H01L 29/0847* (2013.01); *H01L 29/1037* (2013.01); *H01L 29/41741* (2013.01); *H01L 29/66666* (2013.01)

(58) Field of Classification Search
CPC ........... H01L 29/7827; H01L 29/41741; H01L 21/823885; H01L 29/0847; H01L 27/092; H01L 29/66666; H01L 29/1037

USPC ........................................................ 257/105
See application file for complete search history.

(56) References Cited

U.S. PATENT DOCUMENTS

| 5,612,563 | A | 3/1997 | Fitch et al. |
| 6,744,082 | B1 | 6/2004 | Forbes et al. |
| 7,098,478 | B2 | 8/2006 | Takaura et al. |

(Continued)

OTHER PUBLICATIONS http://www.jhaj.net/jasjeet/tcad/Learn2/I2j.htm, Solid-solubility limit.
(Continued)

*Primary Examiner* — Mohammad M Hoque
(74) *Attorney, Agent, or Firm* — Daniel P. Morris; Lou Percello, Attorney, PLLC

(57) ABSTRACT

A first vertical T-FET has a source heavily doped with a source concentration of a source-type dopant, a drain doped with a drain concentration of a drain-type dopant, and a channel between the source and drain. The source, channel, and drain are stacked vertically in a fin or pillar perpendicular to a substrate. A gate stack encompasses the channel sides and has a drain overlap amount overlapping the drain sides and a source overlap amount overlapping the source sides. External contacts electrically connect the gate and source and/or drain. The source-type dopant and the drain-type dopant are opposite dopant types. In some embodiments, a second vertical T-FET is stacked on the first vertical T-FET. Different VT-FET devices are made by changing the materials, doping types and levels, and connections to the sources, channels, and drains. Device characteristics are designed/changed by changing the amount of source and drain overlaps of the gate stack(s).

9 Claims, 13 Drawing Sheets

(51) Int. Cl.
*H01L 29/66* (2006.01)
*H01L 29/08* (2006.01)

(56) References Cited

U.S. PATENT DOCUMENTS

| | | |
|---|---|---|
| 7,683,428 B2 | 3/2010 | Chidambarrao et al. |
| 7,700,993 B2 | 4/2010 | Cai et al. |
| 9,177,890 B2 | 11/2015 | Du |
| 9,659,963 B2 | 5/2017 | Cheng et al. |
| 9,680,473 B1 | 6/2017 | Anderson et al. |
| 2006/0261406 A1 | 11/2006 | Chen et al. |
| 2015/0069458 A1 | 3/2015 | Li et al. |
| 2016/0043074 A1 | 2/2016 | Hurley et al. |
| 2016/0365456 A1* | 12/2016 | Liu .................... H01L 29/7883 |
| 2017/0025412 A1 | 1/2017 | Jun et al. |
| 2017/0345909 A1* | 11/2017 | Masuoka .............. H01L 21/762 |

OTHER PUBLICATIONS

"Solid-solubility limits in silicon, Silicon VLSI Technology" by Plummer, Deal, & Griffin, Fig. 7-4, p. 376.
Appendix P.

\* cited by examiner

STACKED VERTICAL TUNNEL FET DEVICES

BACKGROUND

The present invention relates to semiconductor devices, and more specifically, to stacked Vertical Transport (VT-FET) devices that are Vertical Tunnel Field Effect Transistor (VT-FET) devices.

Vertical Transport FETs (VTFET) have been explored as a viable device architecture for extending Complementary Metal Oxide Semiconductor (CMOS) below 7 nanometer line widths. Conventional vertical transistors are devices where the source-drain current (or drive current) flows in a direction normal to a surface of a semiconductor substrate. In such devices, a vertical semiconductor material forms a pillar or fin that contains the components of the transistor, e.g., the channel with the source and drain located at opposing ends of the pillar/fin.

Tunnel FETs (T-FETs) have been shown to operate with low power consumption. However, vertical (and planar) T-FETs are difficult to manufacture with tight controls and accordingly have less than optimal threshold voltages and drive currents. T-FETs are hard to vertically stack. Also, planar T-FETs take a relatively large amount of surface area of the substrate on which they are deposed.

As CMOS circuits shrink in size, there is a need for devices, like inverter circuits and memory circuits, that use smaller substrate surface area, consume lower power, and have improved design tolerances and operating characteristics.

SUMMARY

Embodiments of the present invention include methods of making and structures enabling vertical tunnel FET (VT-FET) devices, e.g. inverters and memory devices. Single VT-FETs are disclosed with accurate component dimensions and configurations that enable manufacture of VT-FETs with improved electrical characteristics. Further, stackable tunnel FETs (T-FETs) are disclosed that enable manufacture and use of devices commonly used in CMOS circuitry. These devices use less power, have improved performance, and minimize use of substrate surface area.

A vertical T-FET has a source heavily doped with a source concentration of a source-type dopant, a drain doped with a drain concentration of a drain-type dopant, and a channel between the source and drain. The source, channel, and drain are stacked vertically in a fin or pillar perpendicular to a substrate. A gate stack has a gate dielectric in physical and electrical contact with the channel sides, a drain overlap amount overlapping the drain sides, and a source overlap amount overlapping the source sides. The gate stack also has a gate working metal in physical and electrical contact with the gate dielectric and, in some cases, in electrical contact with an external gate contact. External contacts electrically connect to the source and/or drain. The source-type dopant and the drain-type dopant are opposite dopant types.

Stacked vertical Tunneling Field Effect Transistor (VT-FET) structures and devices are also disclosed.

A vertical first T-FET has a first source heavily doped with a first source concentration of a first-source-type dopant, a first drain doped with a first drain concentration of a first-drain-type dopant, and a first channel between the first source and first drain. The first channel is disposed on the first source and the first drain is disposed on the first channel in a fin or pillar perpendicular to a substrate. A first gate stack has a gate dielectric in physical and electrical contact with the first channel sides, a first drain overlap amount overlapping the first drain sides, and a first source overlap amount overlapping the first source sides. The first gate stack also has a first gate working metal in physical and electrical contact with the first gate dielectric. The first-source-type dopant and the first-drain-type dopant are opposite dopant types.

A vertical second T-FET has a second source heavily doped with a second source concentration of a second-source-type dopant, a second drain doped with a second drain concentration of a second-drain-type dopant, and a second channel between the second source and second drain. The second T-FET is stacked on the first T-FET so the second drain is disposed on the first drain, the second channel is disposed on the second drain, and the second source is disposed on the second channel in the fin or pillar. A second gate stack has a gate dielectric in physical and electrical contact with the second channel sides, a second drain overlap amount overlapping the second drain sides, and a second source overlap amount overlapping the second source sides. The second gate stack also has a second gate working metal in physical and electrical contact with the first gate dielectric. The source-source-type dopant and the second-drain-type dopants are opposite dopant types.

An external gate contact electrically connects the first and/or second gate working metal to external circuitry. An external first source contact and an external second source contact electrically connect the first source and second source, respectively, to external circuitry. In some embodiments, an external drain contact electrically connects the first and second drains in common and to external circuitry. In other embodiments, the first and second drains are electrically connected in common internally.

Different VT-FET devices are made by changing the materials, doping types and levels, and connections to the sources, channels, and drains. Device characteristics are designed/changed by changing the amount of source and drain overlaps of the gate stack(s).

BRIEF DESCRIPTION OF THE DRAWINGS

Various embodiments of the present invention will be described below in more detail, with reference to the accompanying drawings, now briefly described. The Figures show various apparatus, structures, and related method steps of the present invention.

DETAILED DESCRIPTION

Figure 1:
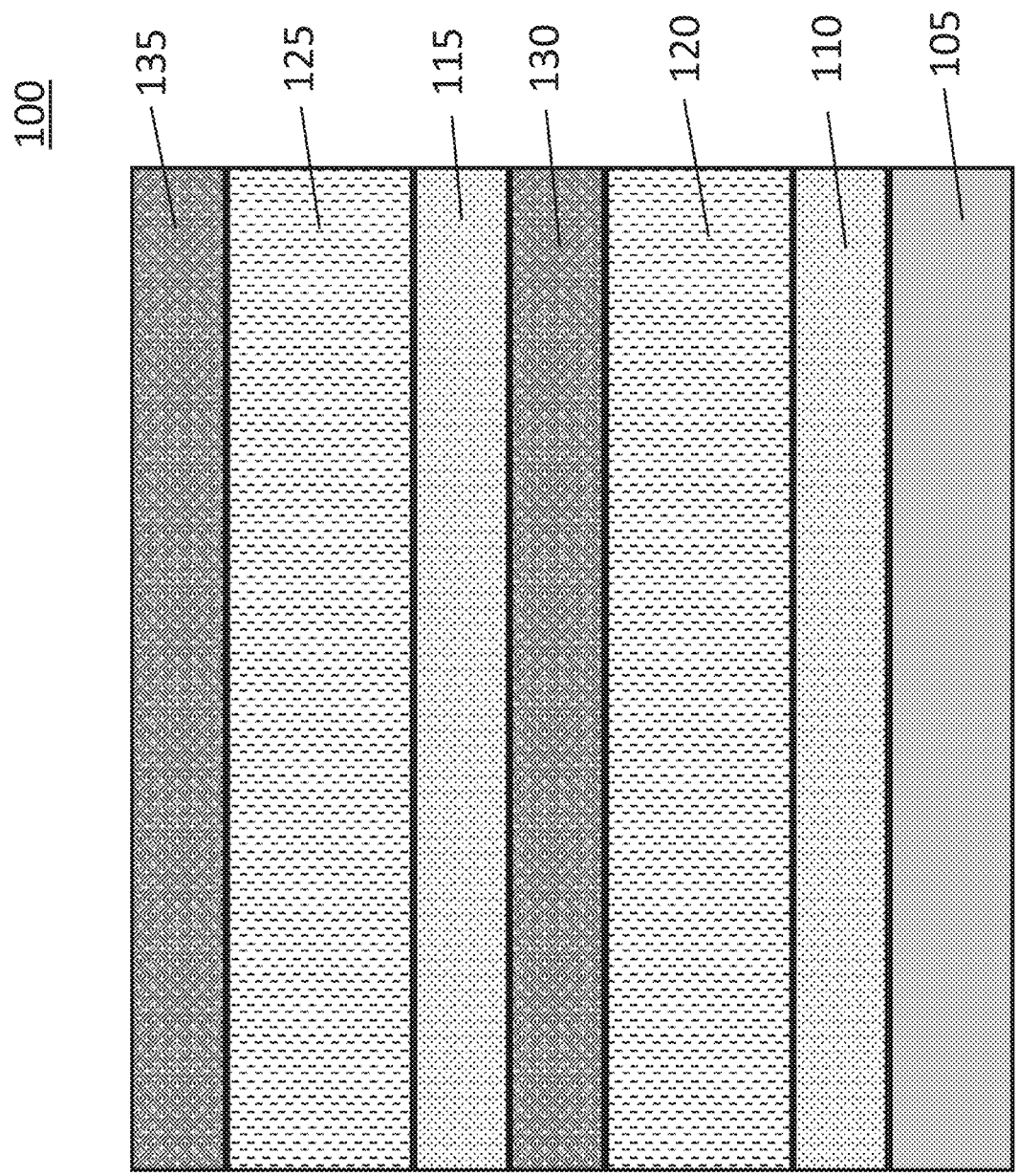
FIG. 1 is a cross section view of an interim structure used to form two stacked tunnel Field Effect Transistor (T-FET) devices.

It is to be understood that embodiments of the present invention are not limited to the illustrative methods, apparatus, structures, systems and devices disclosed herein but instead are more broadly applicable to other alternative and broader methods, apparatus, structures, systems and devices that become evident to those skilled in the art given this disclosure.

In addition, it is to be understood that the various layers, structures, and/or regions shown in the accompanying drawings are not drawn to scale, and that one or more layers, structures, and/or regions of a type commonly used may not be explicitly shown in a given drawing. This does not imply that the layers, structures, and/or regions not explicitly shown are omitted from the actual devices.

In addition, certain elements may be left out of a view for the sake of clarity and/or simplicity when explanations are not necessarily focused on such omitted elements. Moreover, the same or similar reference numbers used throughout the drawings are used to denote the same or similar features, elements, or structures, and thus, a detailed explanation of the same or similar features, elements, or structures will not be repeated for each of the drawings.

The semiconductor devices, structures, and methods disclosed in accordance with embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, expert and artificial intelligence systems, functional circuitry, neural networks, etc. Systems and hardware incorporating the semiconductor devices and structures are contemplated embodiments of the invention.

As used herein, "height" refers to a vertical size of an element (e.g., a layer, trench, hole, opening, etc.) in the cross-sectional or elevation views measured from a bottom surface to a top surface of the element, and/or measured with respect to a surface on which the element is located.

Conversely, a "depth" refers to a vertical size of an element (e.g., a layer, trench, hole, opening, etc.) in the cross-sectional or elevation views measured from a top surface to a bottom surface of the element. Terms such as "thick", "thickness", "thin" or derivatives thereof may be used in place of "height" where indicated.

As used herein, "lateral," "lateral side," "side," and "lateral surface" refer to a side surface of an element (e.g., a layer, opening, etc.), such as a left or right-side surface in the drawings.

As used herein, "width" or "length" refers to a size of an element (e.g., a layer, trench, hole, opening, etc.) in the drawings measured from a side surface to an opposite surface of the element. Terms such as "thick", "thickness", "thin" or derivatives thereof may be used in place of "width" or "length" where indicated.

As used herein, terms such as "upper", "lower", "right", "left", "vertical", "horizontal", "top", "bottom", and derivatives thereof shall relate to the disclosed structures and methods, as oriented in the drawing figures. For example, as used herein, "vertical" refers to a direction perpendicular to the top surface of the substrate in the elevation views, and "horizontal" refers to a direction parallel to the top surface of the substrate in the elevation views.

As used herein, unless otherwise specified, terms such as "on", "overlying", "atop", "on top", "positioned on" or "positioned atop" mean that a first element is present on a second element, wherein intervening elements may be present between the first element and the second element. As used herein, unless otherwise specified, the term "directly" used in connection with the terms "on", "overlying", "atop", "on top", "positioned on" or "positioned atop," "disposed on," or the terms "in contact" or "direct contact" means that a first element and a second element are connected without any intervening elements, such as, for example, intermediary conducting, insulating or semiconductor layers, present between the first element and the second element.

It is understood that these terms might be affected by the orientation of the device described. For example, while the meaning of these descriptions might change if the device was rotated upside down, the descriptions remain valid because they describe relative relationships between features of the invention.

Refer now to the Figures.

FIG. 1 is a cross section view of a preliminary structure 100 used to form a stacked tunnel Field Effect Transistor (T-FET) device.

The structure 100 has a semiconductor substrate 105. The substrate 105 can be made from a single element (e.g., silicon, Si or germanium, Ge), primarily a single element (e.g., with doping), or a compound, for example, aluminum oxide ($Al_2O_3$), gallium arsenide (GaAs), silicon carbide (SiC), or silicon-germanium (SiGe). In some embodiments, the substrate 105 includes one or more semiconductor materials including, but not limited to, silicon (Si), SiGe, SiC, Si:C (carbon doped silicon), silicon germanium carbide (SiGeC), germanium (Ge), carbon doped silicon germanium (SiGe:C), Si alloys, Ge alloys. III-V materials (e.g., GaAs, aluminum gallium arsenide (AlGaAs), indium arsenide (InAs), indium phosphide (InP), aluminum arsenide (AlAs), etc.), II-V materials (e.g., cadmium selenide (CdSe), cadmium sulfide (CdS), cadmium telluride (CdTe), zinc oxide (ZnO), zinc selenide (ZnSe), zinc sulfide (ZnS), zinc telluride (ZnTe), zinc cadmium selenide (ZnCdSe), etc., or any combination thereof) or other like semiconductors. In addition, multiple layers of the semiconductor materials can be used as the semiconductor material of the substrate 105. In some embodiments, the substrate 105 includes both semiconductor materials and dielectric materials. In some silicon on insulator (SOI) implementations, a buried oxide layer, BOX, (e.g., SiO2) is buried in the substrate 105.

Multiple layers (e.g. 110, 120, 130, 115, 125, and 135) are epitaxially grown on top of one another as described below to complete the structure 100. Epitaxial grown silicon, silicon germanium (SiGe), germanium (Ge), and/or carbon doped silicon (Si:C) can be in-situ doped, meaning dopants are incorporated into the epitaxy layers during the growth/ deposition of the respective epitaxial layer. Other alternative doping techniques can be used, including but not limited to, ion implantation, gas phase doping, plasma doping, and plasma immersion ion implantation, etc.

In an epitaxial grown P-type layer, dopants can be selected from a non-limited group of boron (B), gallium (Ga), indium (In), and thallium (Tl). In an epitaxial grown N-type layer, dopants can be selected from a non-limited group of phosphorus (P), arsenic (As) and antimony (Sb). In either case, dopants can exist at various concentrations.

In some embodiments as described in more detail below, layers 110, 120, and 130 will form a first tunnel FET (e.g., a tunnel pFET or a T-pFET) and layers 115, 125, and 135 will form a second tunnel T-FET (e.g., a T-nFET) in a stacked configuration. In formation of a single (non-stacked) tunnel FET (e.g., a single T-pFET or T-nFET), layers 115, 125, and 135 will be omitted.

Layer 110 is a heavily doped layer with a first-source-type dopant (e.g. an N++ layer), that will become a first source of a first T-FET (e.g. a T-pFET). In some embodiments, layer 110 is an in-situ phosphorus doped Si layer with a dopant concentration (first source concentration) above $1 \times 10^{20}$ $cm^{-3}$. Layer 110 is epitaxially grown on the substrate 105 and has a thickness between 50 nanometers (nm) and 200 nm. Other thicknesses are possible.

Layer 120 is an undoped or lightly doped layer that will become a first channel of the first T-FET. In some embodiments, layer 120 is made of Si and a light P-type dopant (or first-drain-type dopant) and can have a concentration between $5 \times 10^{17}$ $cm^{-3}$ and $1 \times 10^{19}$ $cm^{-3}$. Layer 120 is epitaxially grown on layer 110 and has a thickness between 20 nm and 100 nm. Other thicknesses are possible.

Layer 130 is a first drain layer that is doped with the first-drain-type dopant and will become a first drain of the first T-FET. In some embodiments, layer 130 is made of Si or SiGe and is in-situ doped with boron (B) with a first drain concentration between $1 \times 10^{19}$ $cm^{-3}$ and $1 \times 10^{20}$ $cm^{-3}$. Layer 130 is epitaxially grown on layer 120 and has a thickness between 50 nm and 100 nm. Other thicknesses are possible.

Note that T-FETs have a source and a drain with opposite doping types. For example, the T-FET source will be doped with a source-type dopant and the T-FET drain will be doped with a drain-type dopant. The T-FET channel will be lightly doped with the drain-type dopant or not doped at all. This configuration enables carriers from the source to tunnel through the channel when the correct biasing is applied to the gate stack deposed over the channel region. The tunneling effect occurs when the gate stack bias causes the conduction band of the intrinsic region of the channel to align with the valence band of the source of the T-FET. The T-FET is switched when the gate stack bias is modulated to cause these bands to change from alignment to miss-alignment.

Layer 115 is a second drain layer doped with a second-drain-type dopant and will become a second drain of a second T-FET (e.g., an T-nFET). In some embodiments, layer 115 is made of Si and is in-situ doped with phosphorus (P) with a second drain concentration between $1 \times 10^{19}$ $cm^{-3}$ and $1 \times 10^{20}$ $cm^{-3}$. Layer 115 is epitaxially grown on layer 130 and has a thickness between 50 nm and 100 nm. Other thicknesses are possible.

Layer 125 is an undoped or lightly doped layer that will become a second channel of the second T-FET. In some embodiments, layer 125 is made of Si lightly doped with the second-drain-type dopant (e.g. N-type dopant) with a concentration between $5 \times 10^{17}$ $cm^{-3}$ and $1 \times 10^{19}$ $cm^{-3}$ or undoped. Layer 125 is epitaxially grown on layer 130 and has a thickness between 20 nm and 100 nm. Other thicknesses are possible.

Layer 135 is a heavily doped layer doped with a second-source-type dopant (e.g. P++ type dopant). Layer 125 will become a second source of the second T-FET (e.g., a T-nFET). In some embodiments, layer 135 is an in-situ boron doped Si or SiGe layer with a second source concentration of dopant over $1 \times 10^{20}$ $cm^{-3}$. Layer 135 is epitaxially grown on the layer 125 and has a thickness between 50 nm and 100 nm. Other thicknesses are possible.

It will be noted that by reversing the correspondence of P-type (N-type) from source-type dopant (drain-type dopant) to drain-type dopant (source-type dopant) in the description of FIG. 1, the stacking order of the T-FETs type reverses. It is further noted that the invention contemplates embodiments of stacking two T-FETs of the same type by doping corresponding layers (e.g. sources 110 and 135; channels 120 and 125; and drains 115 and 130) with the same dopant type in the same or similar manner.

In addition, when making a single vertical T-FET, layers 115, 125, and 135 may not be grown or alternatively not electrically connected in later steps.

The terms "epitaxially growing and/or depositing" and "epitaxially grown and/or deposited" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, each semiconductor layer of the epitaxial semiconductor material stack has the same crystalline characteristics as the deposition surface on which it is formed.

Examples of various epitaxial growth process apparatuses that can be employed in the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition typically ranges from 550° C. to 900° C. Although higher temperature typically results in faster deposition, the faster deposition may result in crystal defects and film cracking. In some embodiments, the gas source for the epitaxial growth may include a silicon containing gas source and/or an admixture of a germanium containing gas source. Examples of silicon gas sources include silane, disilane, trisilane, tetrasilane, hexachlorodisilane, tetrachlorosilane, dichlorosilane, trichlorosilane, and combinations thereof. Examples of germanium gas sources include germane, digermane, or combinations thereof. In some embodiments, an epitaxial SiGe alloy can be formed from a source gas that includes a compound containing silicon and germanium. Carrier gases like hydrogen, nitrogen, helium and argon can be used. For the epitaxial growth of a layer an appropriate type dopant is added to the precursor gas or gas mixture. In some embodiments of channel material layers, no dopant is typically present in, or added into, the precursor gas or gas mixture.

In a preferred embodiment, layers 110, 120, 130, 115, 125, and 135 are grown by an integrated epitaxy process. In an integrated epitaxy process the structure is epitaxially grown continuously while the type and/or the concentration of dopants changes at different times and time periods to create the different layers with different dopants and dopant concentrations. Some temperature adjustments may be made for one or more of the layers during the epitaxial growth as well.

Figure 2:
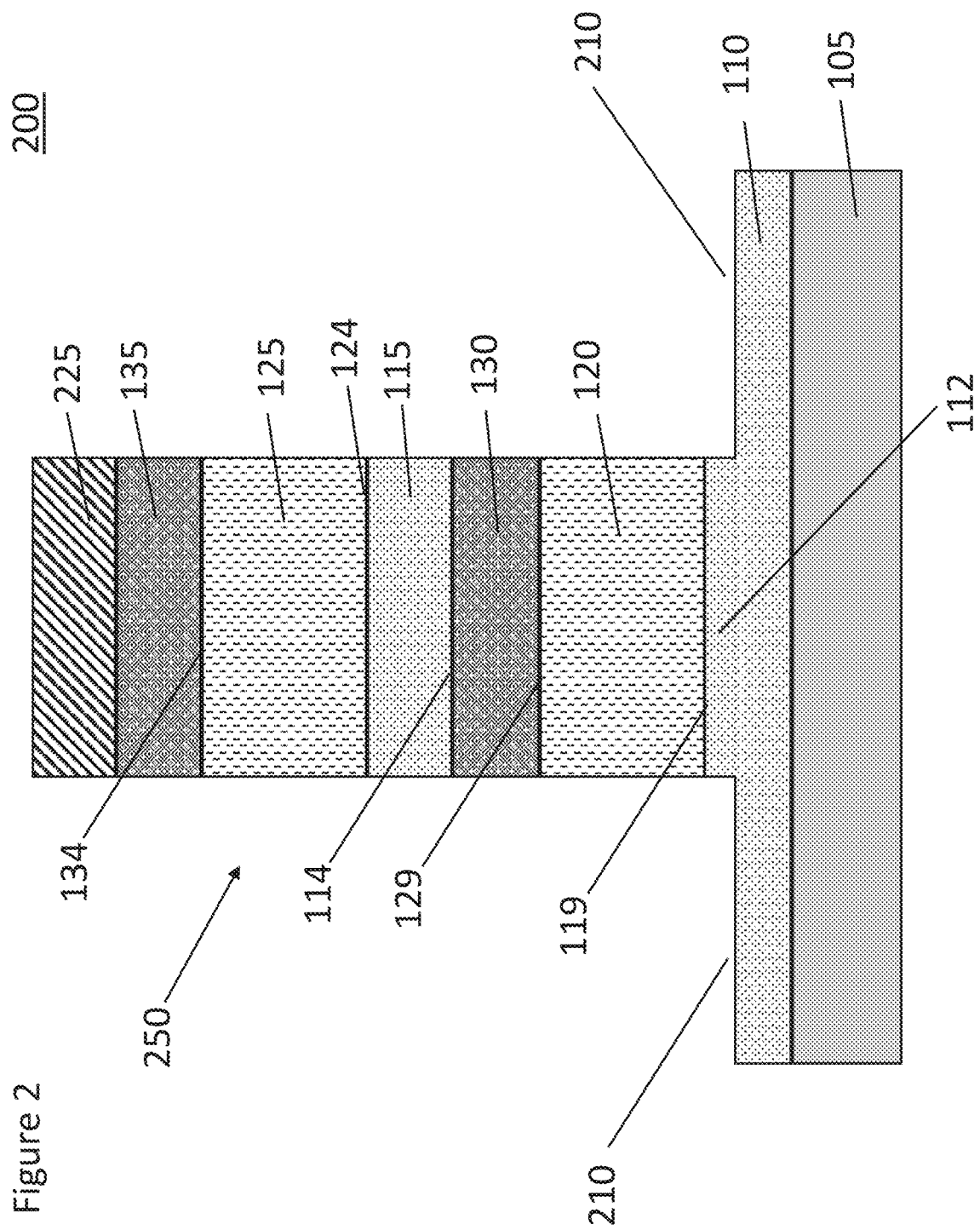
FIG. 2 is a cross section view of an interim structure showing formation of a fin.

FIG. 2 is a cross section view of an interim structure 200 showing formation of a fin 250.

In one embodiment of forming the fin 250, a hard mask 225 is deposited on structure 100. Non-limiting examples of hard mask 225 materials are silicon nitride (SiN), silicon-borocarbonitride (SiBCN), silicon oxycarbonitride (SiOCN), and silicon oxynitride (SiON). The hard mask 225 is deposited by conventional techniques like CVD, PVD, ALD, and plasma enhanced chemical vapor deposition (PECVD). The hard mask 225 etching is performed by known techniques, for example, reactive ion etching (RIE), plasma etching, ion etching, or laser ablation. The etching can further include a wet chemical etching process in which one or more chemical etchants are employed to remove portions of the layers. The hard mask can have a thickness between 10 nm and 25 nm, although other thicknesses are possible.

The hard mask 225 protects a region of the structure 100 below the hard mask 225 during an etching process. Another standard etching process removes portions of the layers 120, 130, 115, 125, and 135 and some of the surface material 210 in layer 110 that are not protected by the hard mask 225. The removed surface material 210 in layer 110 leaves a pedestal 112 on the layer 110.

A pillar or fin structure 250 remains made of the layers (120, 130, 115, 125, 135, and the pedestal 112 of layer 110) under the region the hard mask 225 protection. In some embodiments, the fin 250 has a width between 5 nm and 30 nm, a vertical height between 250 nm and 700 nm, and a length (into and out of the figure, not shown) between 20 nm to 300 nm. Other dimensions are possible.

The first source (110, 112) has an interface 119 with the first channel 120. The first channel 120 has an interface 129 with the first drain 130. The first channel 120 is disposed on the first source (110, 112) and the first drain 130 is disposed on the first channel 120 with the first channel 120 between the first source (110, 112) and the first drain 130.

The first drain 130 has an interface 114 with the second drain 115. The second drain 115 has an interface 124 with the second channel 125 and the second channel 125 has an interface 134 with the second source 135. The second drain 115 is disposed on the first drain, the second channel 125 is disposed on the second drain 115, and the second source 135 is disposed on the second channel 125 with the second channel 125 between the second source 135 and second drain 115.

Figure 3:
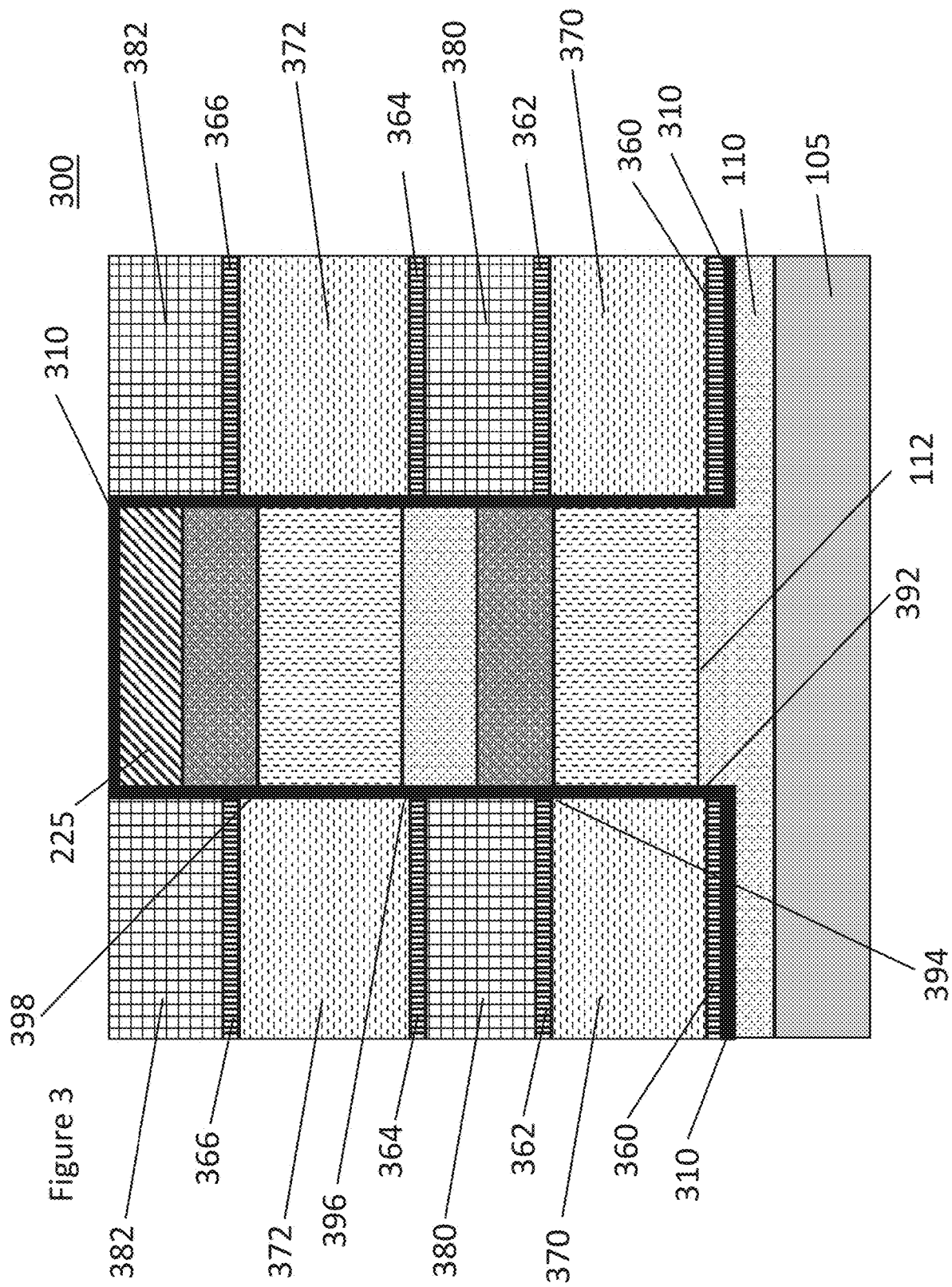
FIG. 3 is a cross section view of an interim structure with dummy placeholders and dummy gates.

FIG. 3 is a cross section view of an interim structure 300 with dummy placeholders (380, 382) and dummy gates (370, 372).

Initially, a thin dielectric or oxide liner 310 about 2 nanometers (nm) thick is conformally formed/deposited around the fin 250 (including the hard mask 225) and on the surface of layer 110. The oxide liner 310 can be formed by low temperature oxidation or conformal deposition techniques like ALD, CVD, PVD, PECVD, Radio Frequency Chemical Vapor Deposition (RFCVD) Pulsed Laser Deposition (PLD), Liquid Source Misted Chemical Deposition (LSMCD), and/or sputtering. In some embodiments, the oxide liner 310 is made of silicon oxide.

After the oxide liner 310 is deposited on structure 200, multiple layers are then directionally deposited in sequence as describe below.

A spacer layer (spacer) 360 is deposited over the horizontal surface of the liner 310 by well-known methods. In some embodiments, the spacer 360 is deposited by a non-conformal deposition, e.g. a high-density plasma (HDP), CVD, or PVD deposition. The non-conformal deposition is followed by a known etch-back process, e.g. a RIE or wet etch back process, that removes spacer 360 material from any vertical surfaces.

In a preferred embodiment, the spacer 360 is between 2 and 20 nm thick (more preferably 6 to 10 nm thick) and made of an electrically insulating material including but not limited to dielectric oxides (e.g., silicon oxide), dielectric nitrides (e.g., silicon nitride), dielectric oxynitrides (SiOCN), SiBCN, or any combination thereof. Spacer 360 materials are selected so as not to be removed during the later removal of the dummy placeholders (380, 382) and dummy gates (370, 372). In some embodiments, the spacer 360 is made of silicon nitride.

A first dummy gate 370 layer is deposited on the spacer 360. The first dummy gate 370 is made of a sacrificial gate material that is selectively different chemically from the spacer (like 360, 362, 364, and 366) material and the dummy placeholder (380, 382) material. Dummy gate material can include, for example, amorphous silicon (α-Si) or polycrystalline silicon (polysilicon). The sacrificial material 370 may be deposited by a deposition process, including, but not limited to, PVD, CVD, PECVD, inductively coupled plasma chemical vapor deposition (ICP CVD), or any combination thereof.

The first dummy gate 370 covers/encompasses the interface 119 between the heavily doped first (e.g., T-pFET) source pedestal 112 and first channel 120 and covers/encompasses the interface 129 between the first channel 120 and first (e.g. T-pFET) drain layer 130.

In addition, the first dummy gate 370 overlaps/encompasses the heavily doped first (e.g., T-pFET) source 110 pedestal 112 by a first source overlap 392 amount and overlaps/encompasses the first T-FET (e.g., T-pFET) drain by a first drain overlap 394 amount.

The first source overlap 392 amount is greater than the first drain overlap 394 amount. In some embodiments, the first drain overlap 394 amount is less than 60% of the first source overlap 392 amount. In some embodiments, the first source overlap 392 is between 2 nm and 10 nm and the first drain overlap 394 is between 1 nm and 9 mm.

The first dummy gate 370 has a thickness between 23 nm and 120 nm and encompasses (both sides and front and back—front and back not shown) the entire first channel 120. However, the thickness of the first dummy gate 370 is primarily chosen to meet the constraints (e.g. overlaps) discussed above and other thicknesses are contemplated.

Spacer 362 is deposited on the dummy gate 370 using one of the same methods, dimension ranges, and materials as described for spacer 360.

A first dummy placeholder 380 layer is deposited on the spacer 362. The first dummy placeholder 380 also is made of a sacrificial material but the first dummy placeholder 380 material is chosen to be selectively not removed while the first dummy gate 370 material is pulled/removed, as described below. In some embodiments, the first dummy placeholder 380 is made of silicon dioxide.

The first dummy placeholder 380 can be deposited by known techniques including, but not limited to, CVD or PVD.

The first dummy placeholder 380 covers and encompasses the interface 114 between the first (e.g. T-pFET) drain 130 and second drain (e.g. T-nFET) 115 layers. In addition, the first dummy placeholder 380 encompasses and overlaps each of the first drain 130 and second drain 115 layers by between 10 nm and 42 nm.

The first dummy placeholder 380 is between 20 nm and 85 nm thick. However, the first dummy placeholder 380 thickness is determined primary to meet the constraints (e.g. overlaps) described above and other thicknesses are contemplated.

Spacer 364 is deposited on the (nFET) dummy placeholder 380 using one of the same methods, dimension ranges, and materials as described for spacers 360 and 362.

A second dummy gate 372 layer is deposited on spacer 364 using the same materials and methods used to deposit the first dummy gate 370.

The second dummy gate 372 covers and encompasses (both sides and front and back—the front and back are not shown) the entire second channel 125. The second dummy gate 372 covers/encompasses the interface 134 between the heavily doped second (e.g. T-nFET) source 135 and second channel 125 and covers/encompasses the interface 124 between the second channel 125 and second (e.g. T-nFET) drain layer 115.

In addition, the second dummy gate 372 overlaps/encompasses the heavily doped second (e.g., T-nFET) source 135 by a second source overlap 398 amount and overlaps/encompasses the second (e.g., T-nFET) drain by a second drain overlap 396 amount.

The second source overlap 398 amount is greater than the second drain overlap 396 amount. In some embodiments, the second drain overlap amount is less than 60% of the second source overlap amount. In some embodiments, the second source overlap is between 2 nm and 10 nm and the second drain overlap is between 1 nm and 9 mm.

The second dummy gate 372 has a thickness between 23 nm and 120 nm. However, the thickness of the second dummy gate 372 is chosen primary to meet the constraints (e.g. overlap) described above, and other thicknesses are contemplated.

A spacer 366 is deposited on the (pFET) dummy gate 372 using one of the same methods and materials as described for spacers 360, 362, and 364.

A second dummy placeholder 382 layer is deposited on the spacer 366 using one of the same methods and materials as described for the first dummy placeholder 380.

The second dummy placeholder 382 covers and encompasses the remaining uncovered highly doped second source 135 layer and the hard mask 225 and has the required thickness, e.g. between 55 nm and 125 nm of thickness.

It will be appreciated that the oxide liner 310, spacers layers (360, 362, 364, and 366), the first 370 and second 372 dummy gate layers, and the first 380 and second 382 dummy placeholder layers fully surround the fin structure 250. For example, all these layers exist in a direction into and out of the figures and cover the front and back sides of the fin structure 250 not shown in the cross-section views of the Figures.

The methods and structures of this invention enable accurate deposition, placement, and thicknesses of layers (110, 120, 130, 115, 125, and 135) of the fin 250 including the spacers (360, 362, 364, and 366), dummy gates (370, 372), and dummy placeholders (380, 382). There is also accurate placement of these structures with respect to one another. These precision accuracies placements enable predictable and precise control of the electrical characteristics of the T-FETs not easily achievable with planar T-FETs or current vertical T-FET designs.

After all the layers are deposited, structure 300 is planarized to level the top surface of structure 300. The planarization is done by known methods like Chemical Mechanical Polishing (CMP). In some embodiments, the CMP terminates either at the top horizontal layer of the oxide liner 310 or at the hard mask 225.

Figure 4:
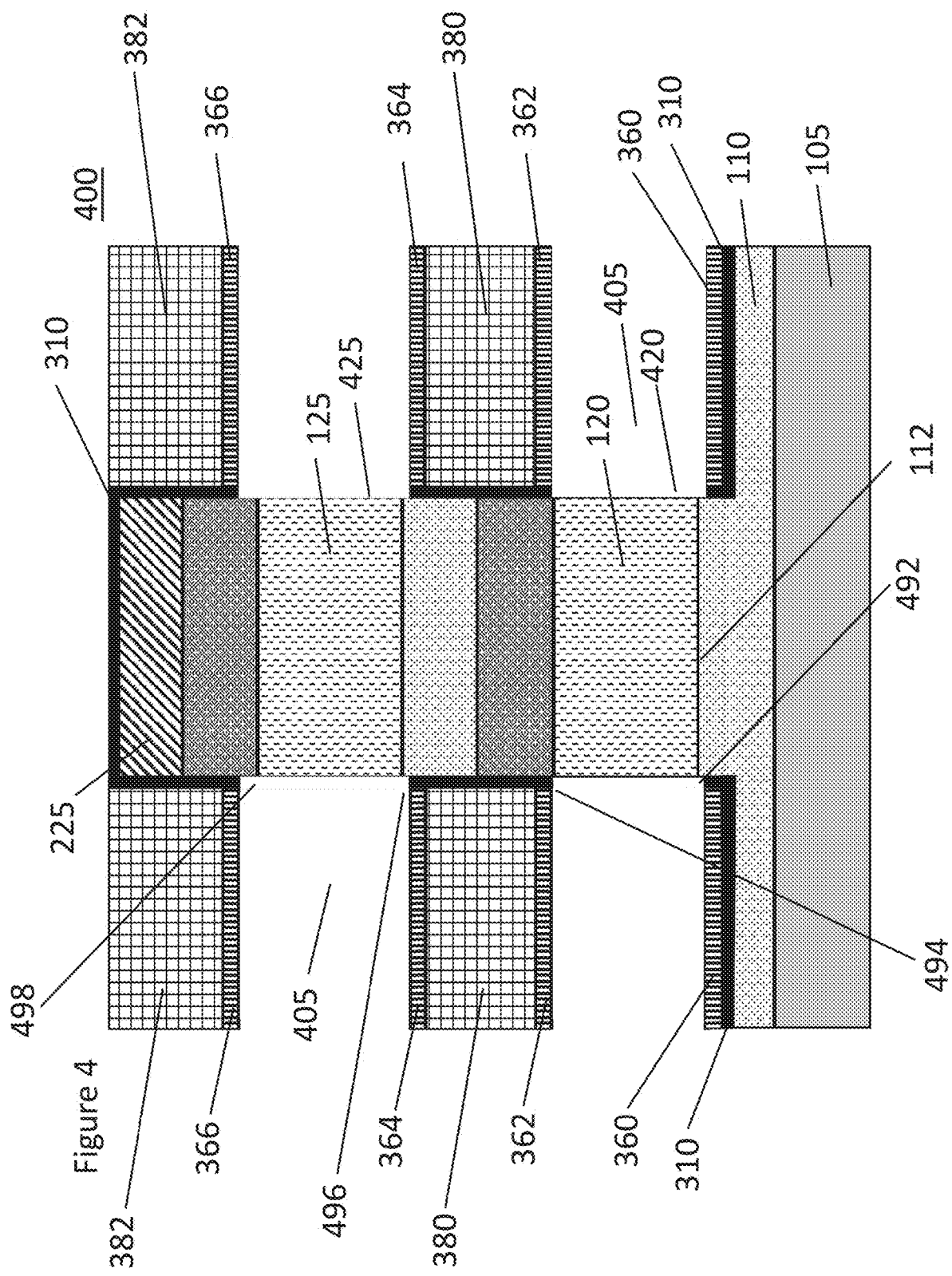
FIG. 4 is a cross section view of an interim structure with the dummy gates pulled.

FIG. 4 is a cross section view of an interim structure 400 with the first and second dummy gates (370, 372) pulled or removed 405. The oxide liner 310 under the dummy gates (370, 372) is also removed, e.g. by an etching step, so that the channel (120, 125) layers, i.e., the sides (420, 425) of the first 120 and second 125 channels, are exposed. A first exposed source overlap 492, first exposed drain overlap 494, second exposed source overlap 498, and second exposed drain overlap 496 are also exposed as shown.

The first and second dummy gates (370, 372) are selectively pulled/removed forming gate cavities 405 between the respective spacers (for the first T-FET between spacers 360 and 362; and for the second T-FET between spacers 364 and 366) by known techniques. For example, a dry etch or exposure to ammonium hydroxide ($NH_4OH$) at higher than room temperature can be used for pulling polysilicon dummy gate material. In some embodiments dummy gate (370, 372) material can be removed using a solution of hydrofluoric acid (HF) or dry chemical oxide etch. The oxide liner 310 in the gate cavities 405 is removed by a selective chemical etch.

Figure 5:
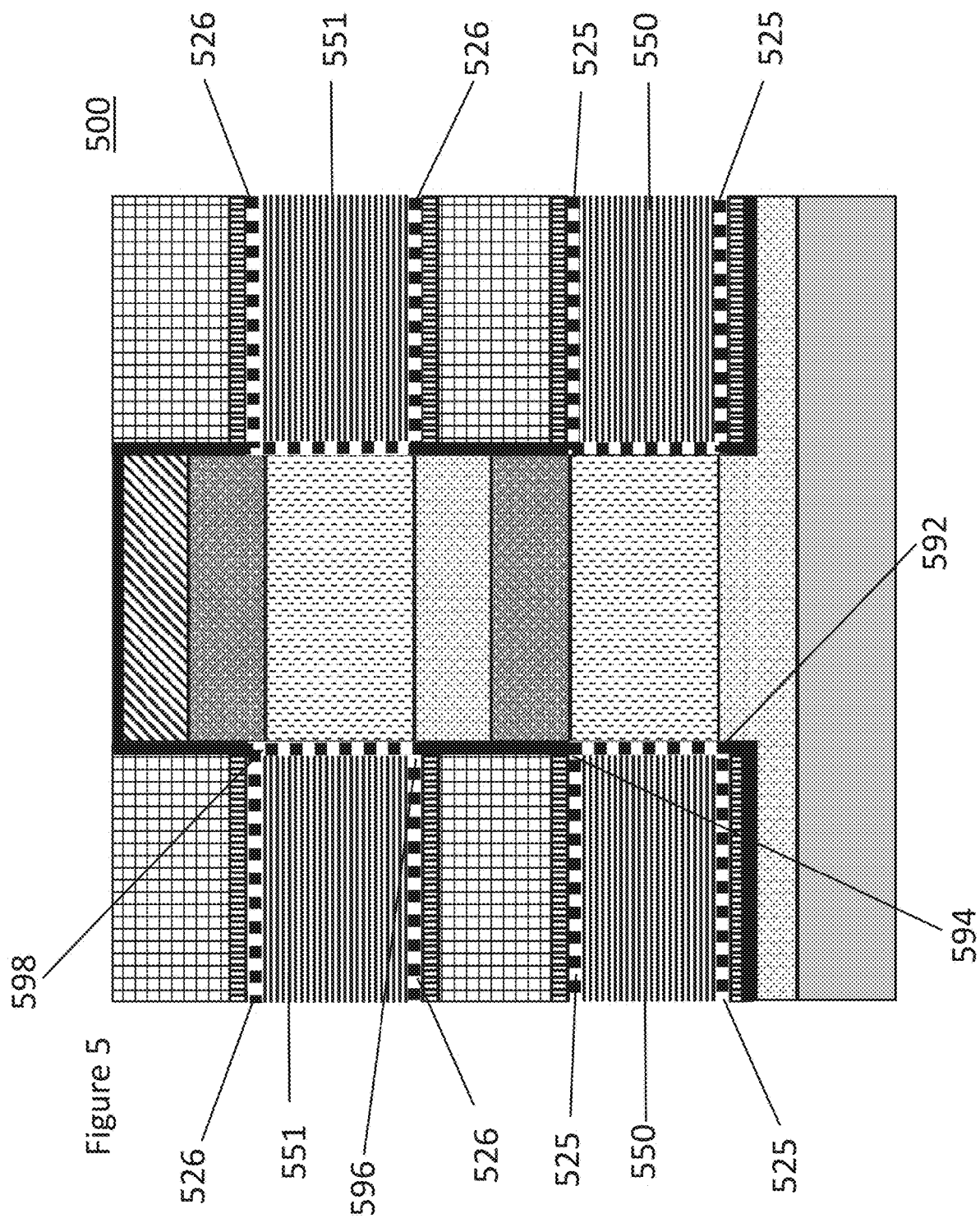
FIG. 5 is a cross section view of an interim structure with gate stacks formed.

FIG. 5 is a cross section view of an interim structure 500 with gate stacks (a first gate stack (525, 550) for the first T-FET, e.g. T-pFET, and a second gate stack (526, 551) for the second T-FET, e.g. T-nFET) formed. Because the pulled dummy gates (370, 372) and the gate cavities 405 wrapped entirely around the fin 250, the gate stacks (525, 550) and (526, 551) formed in the cavities 405 will also wrap around (not shown) the entire fin. The gate stacks wrap around the front, back, and sides of the fin 250.

Due to the accurate sizing and positioning of the dummy gates (380, 382) the overlaps remain in the same positions with the same dimensions and relationships. For example, the gate stacks (525, 550) and (526, 551) have gate overlaps including a first gate source overlap 592, a first gate drain overlap 594, a second gate source overlap 598, and a second gate drain overlap 596 as shown. These gate overlaps (592, 594, 596, and 598) correspond to the overlaps of the dummy gates (380, 382) and have the same positions, dimensions, and relationships.

The gate stacks, (525, 550) and (526, 551), for each of the tunnel FETs are made of a dielectric layer (525, 526) and a work function metal (550, 551, respectively). Both T-FETs can have the same material for the dielectric layer (525, 526). However, in some embodiments, a first work function metal 550 for the first T-FET (e.g. a T-pFET) will be different than a second work function metal 551 for the second T-FET (e.g. a T-nFET). In these instances, known blocking and deposition techniques are used to deposit the appropriate work function metals (550, 551) on the gate stack of the correct tunnel FET.

Gate dielectric layer (525, 526) materials can be a dielectric material having a dielectric constant greater than 3.9, more preferably above 7.0, and still more preferably above 10.0. Non-limiting examples of suitable materials for the gate dielectric layer (525, 526) material include oxides, nitrides, oxynitrides, or any combination thereof. Examples of high-k materials (with a dielectric constant greater than 7.0) include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material may further include dopants such as, for example, lanthanum and aluminum.

The gate dielectric layer (525, 526) material may be formed by suitable deposition processes, for example, CVD, PECVD, ALD, evaporation, PVD, chemical solution deposition, or other like processes. The thickness of the gate dielectric layer (525, 526) may vary depending on the deposition process as well as the composition and number of high-k dielectric materials used.

The work function metal for a T-pFET (i.e. a T-FET with a p-type doped drain) include but are not limited to: titanium nitride (TiN), tantalum nitride (TaN), ruthenium (Ru), palladium (Pd), platinum (Pt), cobalt (Co), nickel (Ni), and conductive metal oxides, or any combination thereof. The work function metal 551 for the tunnel nFET is deposited while the gate cavity 405 for the nFET is blocked by similar deposition techniques.

The work function metal for a T-nFET (i.e. a T-FET with an n-type doped drain) include, but are not necessarily limited to, titanium nitride (TiN), titanium aluminum nitride (TiAlN), titanium aluminum carbon nitride (TiAlCN), titanium carbide (TiC), titanium aluminum carbide (TiAlC), tantalum aluminum carbide (TaAlC), tantalum aluminum carbon nitride (TaAlCN), lanthanum (La) doped TiN or TaN, Hafnium (Hf), zirconium (Zr), titanium (Ti), tantalum (Ta), aluminum (Al), metal carbides (e.g., hafnium carbide (HfC), zirconium carbide (ZrC), titanium carbide (TiC), and aluminum carbide ($Al_4C_3$)), aluminides, or any combination thereof.

The T-FET work function metal 550 (551) is deposited over the gate dielectric layer (525, 526) of one of the T-FETs while the gate cavity 405 for the oppositely doped other T-FET is blocked. Deposition techniques including, but are not limited to CVD, PECVD, RFCVD, PVD, ALD, PLD, LSMCD, and/or sputtering.

In some embodiments, both work function metals (550, 551) are deposited by an ALD process.

Figure 6:
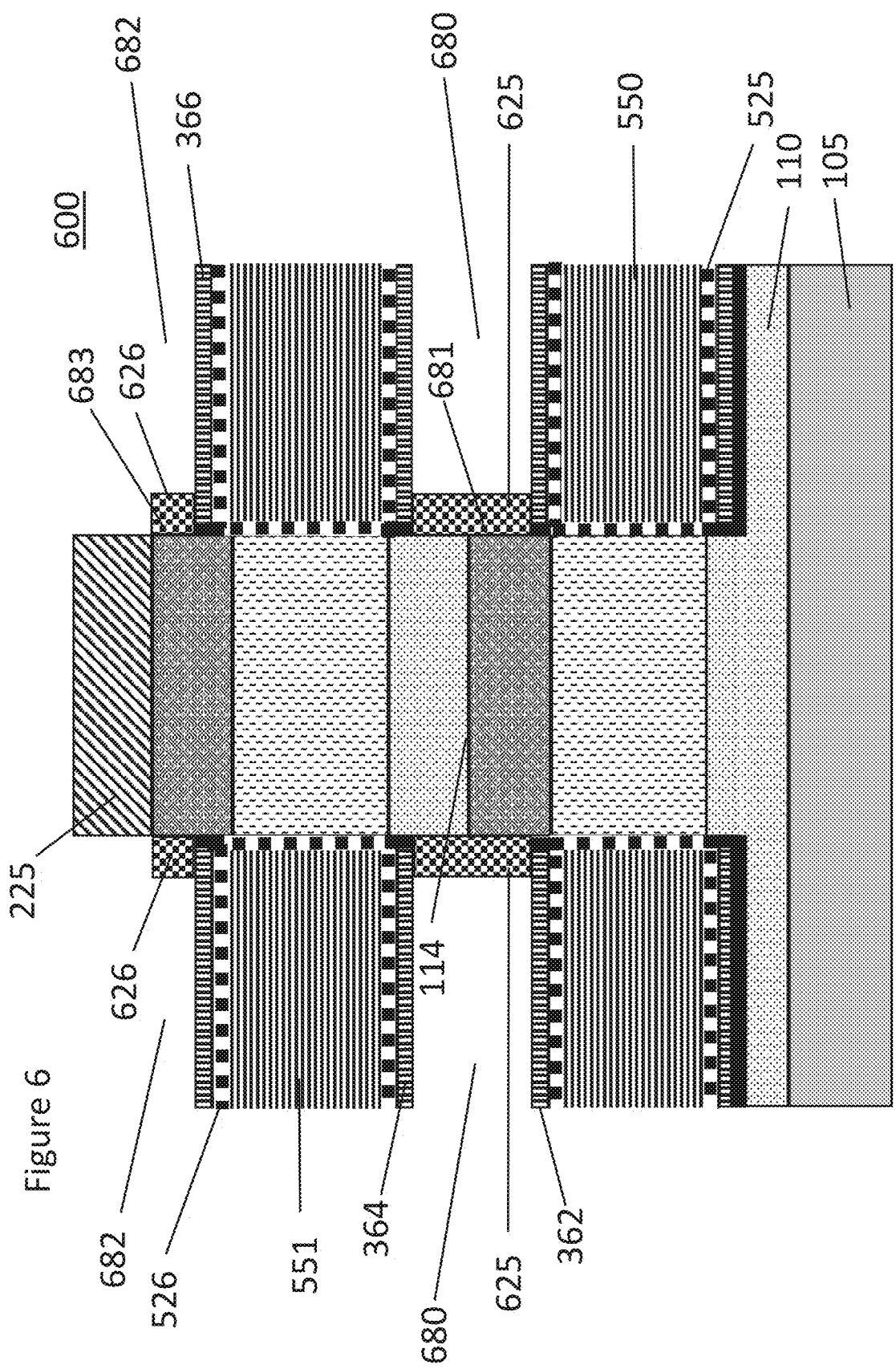
FIG. 6 is a cross section view of an interim structure with dummy placeholders removed and the drains of the first tunnel FET and second tunnel FET electrically connected.

FIG. 6 is a cross section view of an interim structure 600 with the first 380 and second 382 dummy placeholders removed, the first and second T-FET drains electrically connected by conductive straps 625, and electrically conductive material 626 deposited on the sides of the second T-FET source.

The dummy placeholders (380, 382) are removed, e.g. by using a known selective etching process that has minimum or no effect on the material making up the spacers (260, 362, 364, and 366) and gate stacks, (525, 550) and (526, 551).

The oxide liner 310 covered by the dummy placeholders (380, 382) is also removed. In some embodiments, where the oxide liner 310 is made of silicon dioxide, the oxide liner 310 is removed by the same process that removes the dummy placeholders (380, 382). Where the oxide liner 310 is made of a different material than the dummy placeholders (380, 382) a second process may be needed to remove the oxide liner 310 and partially expose the surface of the sides (681 and 683) of the drains (115, 130) and second source 135.

A placeholder cavity 680 is formed around the part of the drains (115, 130), not covered by spacers (362, 364). A placeholder cavity 682 is formed around the protruding part (not covered by the gate stack (526, 551) and spacer 366) of the highly doped second source 135, where the dummy placeholders (380, 382) formally were. Part of the sides (681 and 683) of the fin 250 are exposed.

An electrically conductive material, e.g. a silicide, is deposited to form an electrical connection/strap or drain connection strap 625 between the first and second drains (115, 130) of the respective first and second T-FETs. The straps 625 form on the sides 681 and electrically short the interface 114, a p-n junction.

During this process, a silicide conductive material 626 or a silicide connection 626, is formed on spacer 366 and in electrical contact with the sides (and front and back) 683 of the protruding portion of the highly doped second source 135.

The electrically connecting silicide strap 625 and silicide conductive material 626 are formed by very well-known processes ("salicide formation"), e.g. deposition of a metal (like Ni) followed by an anneal (exemplary between 410 and 425 degrees Celsius for about 15 minutes) and then removal of the unreacted metal.

Depending on the embodiment and as described below, sometimes the drain connection strap 625 is an internal, common drain connection. These devices have no need of an external drain connection. In other embodiments, the drain connection strap 625 (the internal common drain connection) connects to an external common drain connection.

In some embodiments, for example when the first 780 and second 790 T-FET are of the same type (e.g. both the first 780 and second 790 T-FETs are either T-pFETs or T-nFETs), the straps 625 are formed to create a common drain (115, 130) connection which is then provided an external connection. In combination with a common gate connection (described below) and externally connecting the first and second source, the first 780 and second 790 T-FETs are connected in parallel and can provide nearly double the source-drain current (drive current) of a single T-FET by using little or no additional surface area of the substrate and approximately one have the surface area used by planar devices.

Figure 7:
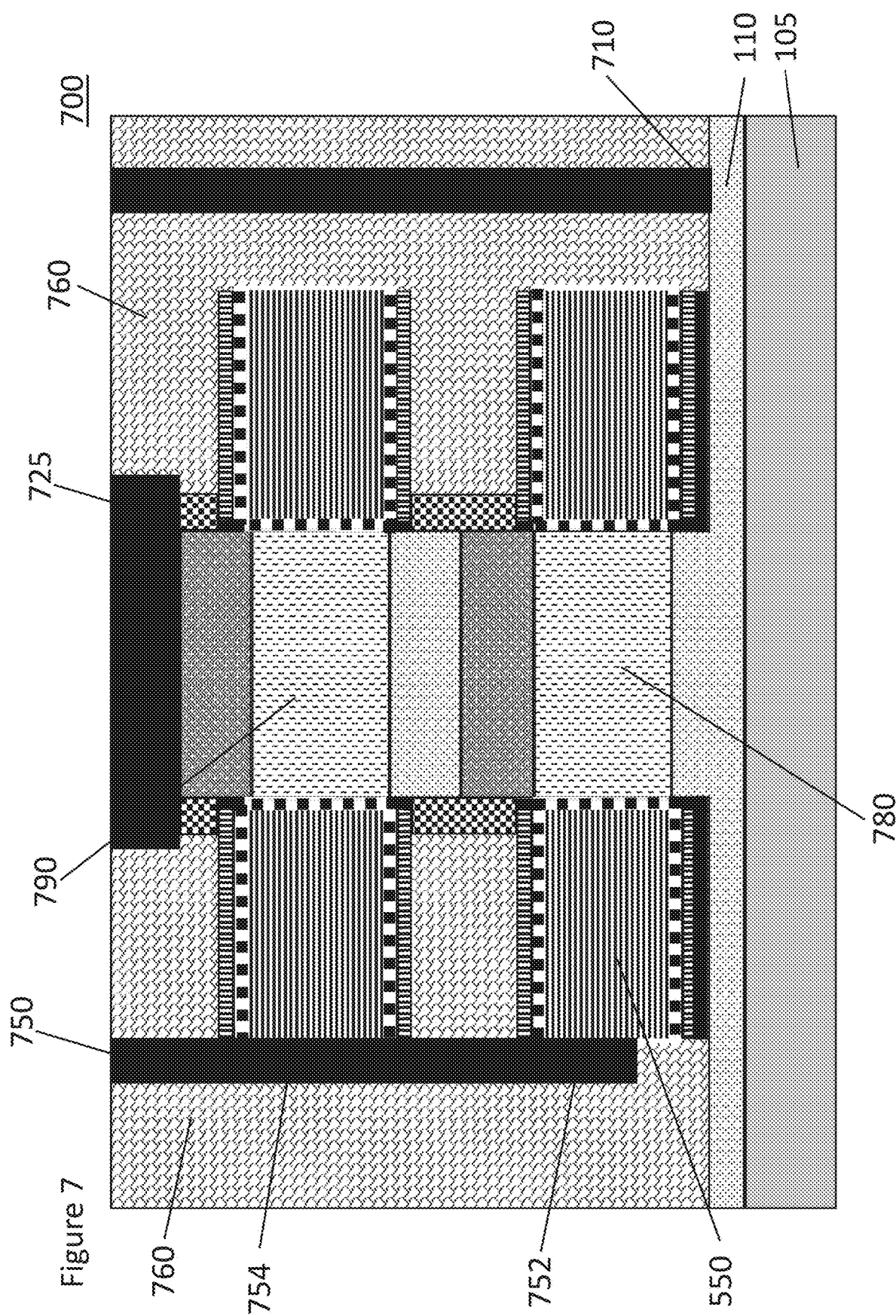
FIG. 7 is a cross section view of one embodiment of a stacked tunnel Field Effect Transistor (T-FET) with the first and second gate stacks connected in common to an external gate connection.

FIG. 7 is a cross section view of a stacked tunnel Field Effect Transistor (FET) device 700 with the second 790 T-FET stacked on the first 780 T-FET.

After the drain connection strap 625 and the silicide connection 626 are formed, the structure 600 is covered with an interlayer dielectric (ILD) 760. The ILD 760, as an example, is made from a low-k dielectric material (with k<4.0), including but not limited to, silicon oxide, spin-on-glass, a flowable oxide, a high-density plasma oxide, borophosphosilicate glass (BPSG), or any combination thereof. The ILD 760 is deposited by a deposition process, including, but not limited to CVD, PVD, PECVD, ALD, evaporation, chemical solution deposition, or like processes. The ILD 760 fills all cavities in the structure 700.

Connections are made to extend from the surface of the ILD 760 to connect the work function metal (550, 551). In this embodiment, each of the gate stacks (525, 550; 526, 551) is electrically connected together by an external gate connection 750. Separate external connections (710, 725) are made to each of the source connections (110, 135), respectively.

In a preferred embodiment, the external contacts (710, 725, and 750) are formed using lithographic techniques. A resist, such as a photoresist, is deposited and patterned on the ILD 760 surface where external contacts (710, 725, and 750) are to be placed in trenches in the ILD 760. In this embodiment, these contacts include an external gate contact 750, a first external source connection 710, and a second source connection 725. The drain contact is common and internal made by the common strap 635 connection. An etch process, such as a RIE, is performed using the patterned resist as an etch mask to remove the ILD 760 until the trenches are formed in the ILD 760.

The trenches are filled with a conductive material or a combination of conductive materials. The conductive material may be a conductive metal, for example, aluminum (Al), platinum (Pt), gold (Au), tungsten (W), titanium (Ti), Cobalt (Co) or any combination thereof.

The conductive material may be deposited by a suitable deposition process, for example, CVD, PECVD, PVD, plating, thermal or e-beam evaporation, or sputtering.

In this embodiment, one trench is filled with conductive material to form the external gate contact 750. The external gate contact 750 electrically connects the work function metals (550, 551) of the first (525, 550) and second (526, 551) gate stacks together in common and connects (752, 754) the gate stacks (525, 550 and 526, 551) externally to the device 700.

Another trench filled with conductive material forms an external second source connection 725 that connects the second source 135 externally to the device 700. The etching process that made the trench for this connection 725 etched through the hard mask 225 to make the connection with second source 135.

A third trench filled with conductive material forms an external first source connection 710 that connects the first source 110 externally to the device 700.

In some embodiments, the first source connection 710 and the second source connection 725 are electrically connected externally. This external connection in combination with the common gate connection made by the external gate contact 750 and the common drain connection made by the drain connection strap 625 render the first and second T-FETs connected in parallel.

Figure 8:
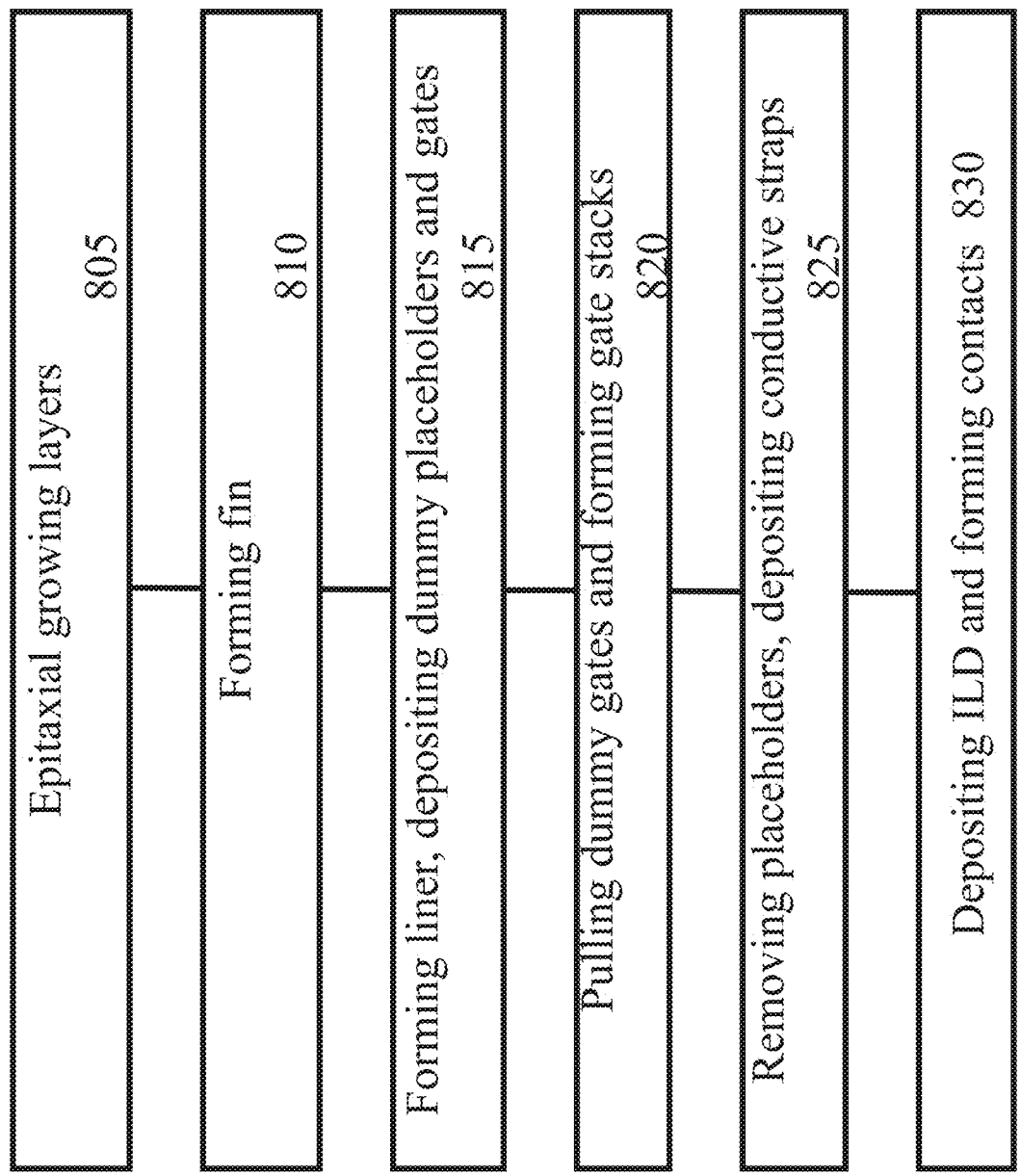
FIG. 8 is a flow chart of a method of making a stacked tunnel FET device.

FIG. 8 is a flow chart of a method 800 of making the vertical T-FETs including vertically stacked T-FET devices.

Step 805 of the method 800 epitaxially grows and dopes layers on a substrate 105 as described in the description of FIG. 1.

In step 810 of the method 800, the fin 250 or pillar 250 structure is formed using the lithography and etching techniques as described in FIG. 2. The resulting fin 250 has layers with accurate thicknesses, placement, and doping concentrations.

Step 815 of the method 800 deposits the oxide liner 310, dummy gates (370, 372), dummy placeholders (380, 382). These dummy gate (370, 372) and dummy placeholder (380, 382) layers along with the spacer layers (360, 362, 364, and 366) are deposited with precise thicknesses and locations with respect to the layers (110/112, 120, 130, 115, 125, and 135) formed in steps 805 and 810 in order to form precisely located and sized overlaps (392, 394, 396, and 396).

Step 820 pulls the dummy gates (370, 372) and forms the first (525, 550) and second (526, 551) gate stacks as described in the description of FIGS. 4 and 5.

The threshold voltage and the source drain current (drive current) of the first T-FET is influenced by the first gate source overlap 592 and the first gate drain overlap 594. The threshold voltage and the source drain current (drive current) of the second T-FET is influenced by the second gate source overlap 598 and the second gate drain overlap 596.

Accordingly, by changing the position and thicknesses of the layers in steps 805 and 810 and the placement and thicknesses of the depositions in step 815, the location and size of the overlaps (392, 394, 396, and 396) are changed. This in turn changes the location and size (amount) of the first and second gate source overlap (592 and 598) and first and second gate drain overlap (594, 596). By changing these gate overlaps, electrical characteristics like threshold voltage and source-drain current can be designed and optimized.

Step 825 removes the dummy placeholders. If required for the device being made, (silicide) conductive straps 625 are deposited to electrically connect the first 130 and second 115 drains.

Step 830 forms the final device by depositing ILD and forming external contacts like 710, 725, and 750.

Figure 9:
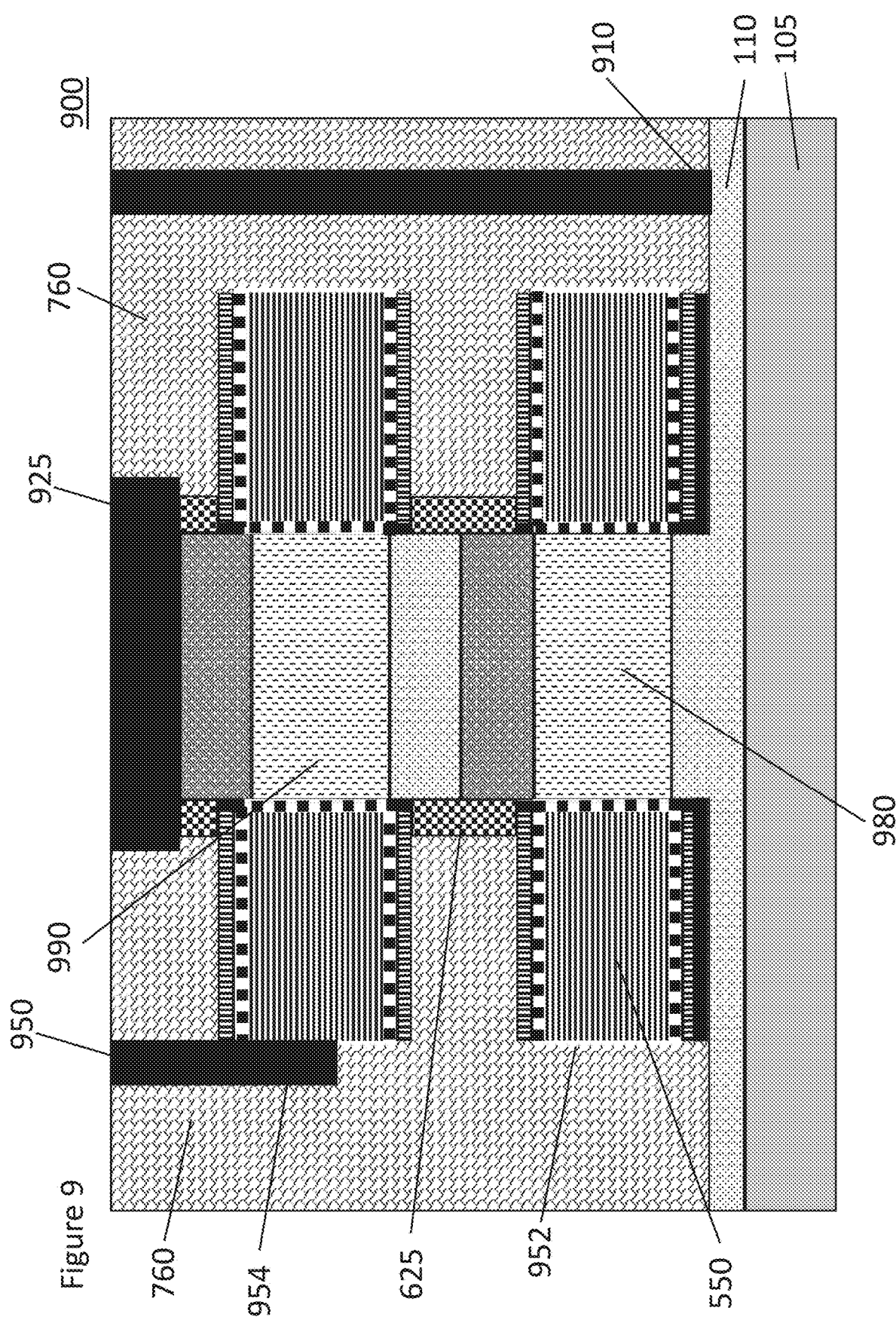
FIG. 9 is a cross section view of one embodiment of a stacked tunnel Field Effect Transistor (T-FET) memory device having a first T-pFET with a floating gate stack.

FIG. 9 is a cross section view of one embodiment of a stacked tunnel Field Effect Transistor (T-FET) memory device 900 having a T-pFET with a floating gate stack.

In this embodiment 900, the first T-FET 980 is a T-pFET 980 and the second T-FET 990 is a T-nFET 990. The external gate connection 950 only connects 954 to a single gate stack (526, 551), in this case the second gate stack for the T-nFET 990. The gate stack (525, 550) for the first T-FET 980 (a T-pFET) is unconnected or left floating 952. The first 130 and second 115 drains are internally connected 625.

Figure 10:
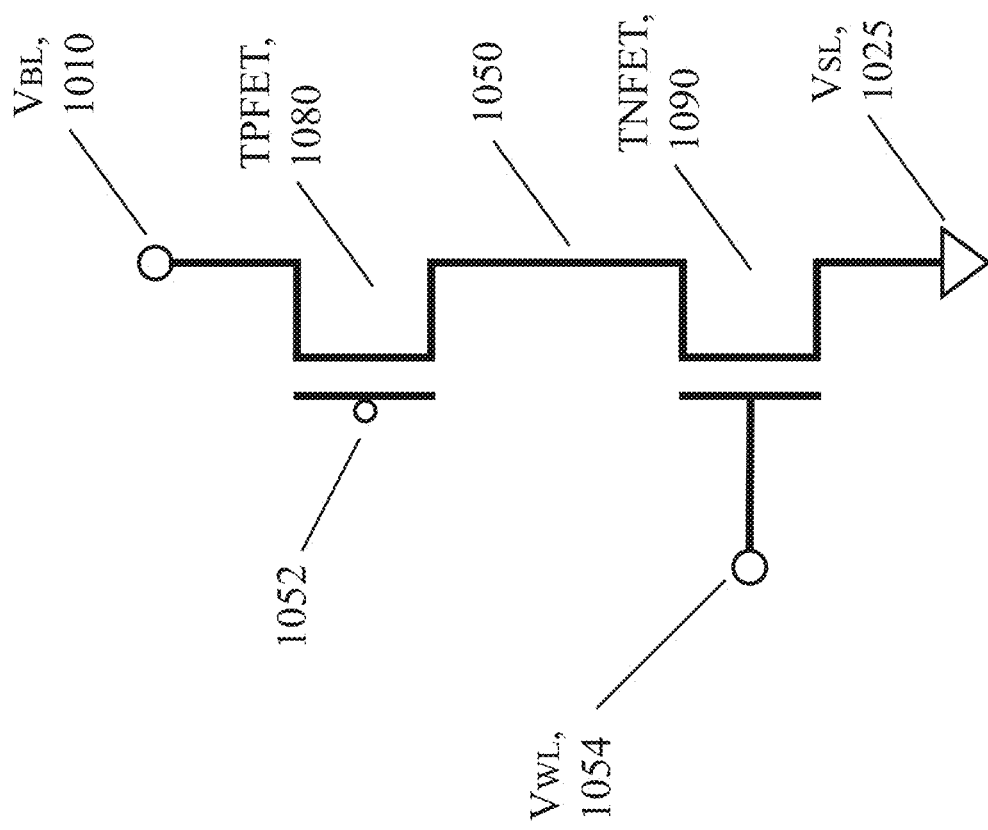
FIG. 10 is a circuit diagram of the stacked T-FET memory device shown in FIG. 9.

FIG. 10 is a circuit diagram 1000 of the stacked T-FET memory device (900, 1000) shown in FIG. 9.

A bit line connection 1010, $V_{BL}$, connects to the first source 910 of the first T-pFET 980. The floating, non-connection (952, 1052) of the T-pFET 980 is shown, as is the common, floating drain connection (1050, 625). The second source connection (925, 1025) to the second T-nFET 990 is connected to a select line 1025, $V_{SL}$. A wordline 1054, $V_{WL}$, is connected to the second gate external connection 950.

Note that while the orientation (top and bottom) of the memory device (900, 1000) appear inverted in FIGS. 9 and 10, the electrical connections are the same and correct for operation. The T-pFET 980 and the T-nFET 990 take about one half of the substrate area than similar planar circuits used for this device because the T-pFET 980 and T-nFET 990 are vertically stacked.

Figure 11:
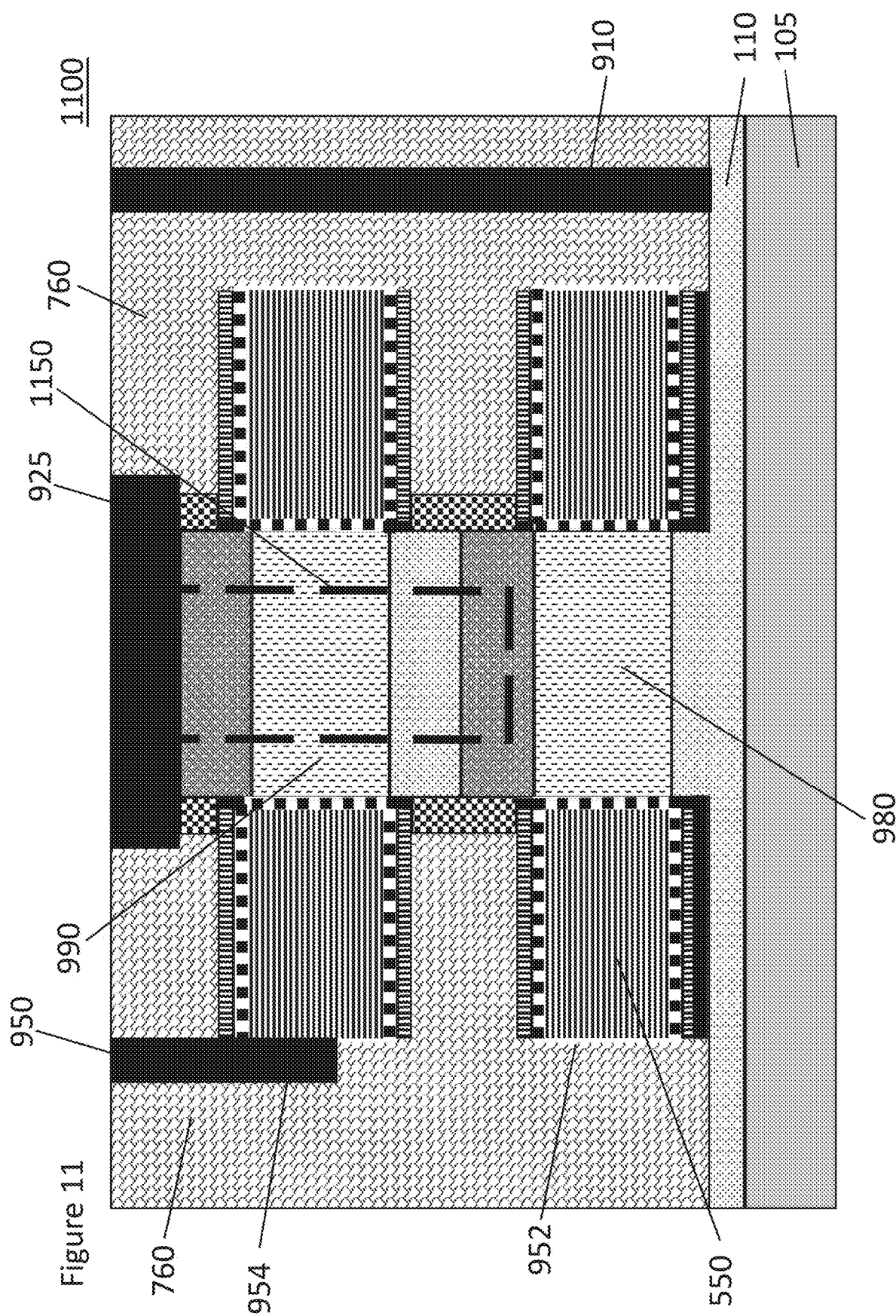
FIG. 11 is a cross section view of one embodiment of a stacked tunnel Field Effect Transistor (T-FET) inverter device having a T-pFET with a floating gate stack and a common, external electrical connection to the first and second drains.

FIG. 11 is a cross section view of one embodiment of a stacked tunnel Field Effect Transistor (T-FET) inverter device 1100 having a first T-pFET 980 with a floating gate stack 952, and a common, external electrical connection 1150 (shown in phantom view) to the first and second drains 625. Again, the external gate connection 950 connects 954 only to the second gate stack (526, 551) of the second T-nFET 990. The first gate stack (525, 550) of the first T-pFET 980 is not connected 952 and floating.

The first 130 and second 115 drains are connected 625 internally. However, in this embodiment, there are one or more external drain connections 1150. These external drain connections 1150 are connected to the common, internal drain connection 625 in planes in the front and/or back of the fin 250. The external drain connection(s) 1150 penetrate through the ILD 760 to electrically and physically connect with the internal common drain connection 625.

Figure 12:
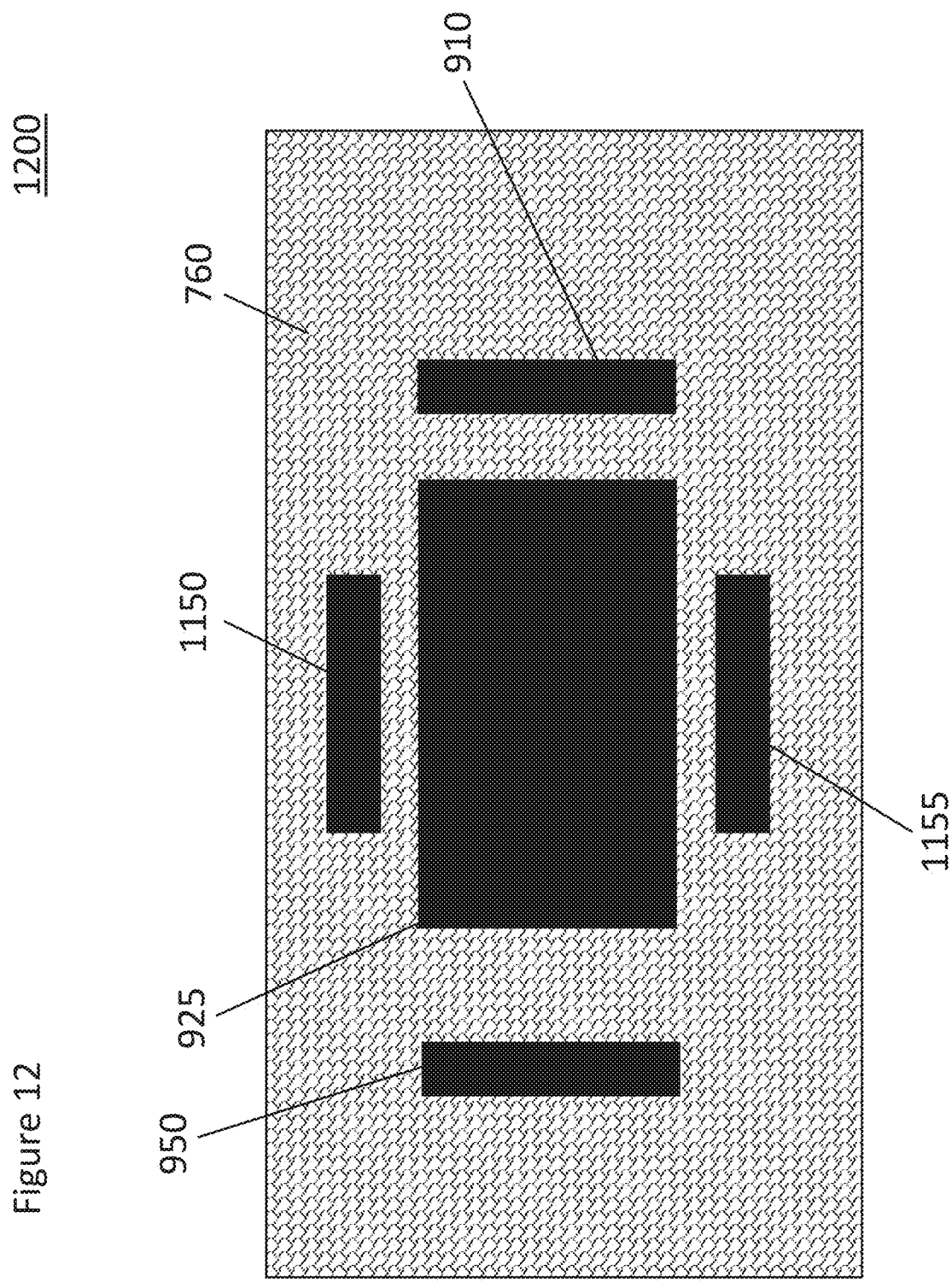
FIG. 12 is a top view of the stacked T-FET inverter device shown in FIG. 11.

FIG. 12 is a top view 1200 of the stacked T-FET inverter device 1100 shown in FIG. 11. The external connections of the first source 910, second source 925, and second gate 950 are shown passing through the ILD 760. The top view 1200 shows how an external connection can be made to the common drain 625 from the front 1155 and/or back 1150 of the fin 250.

Figure 13:
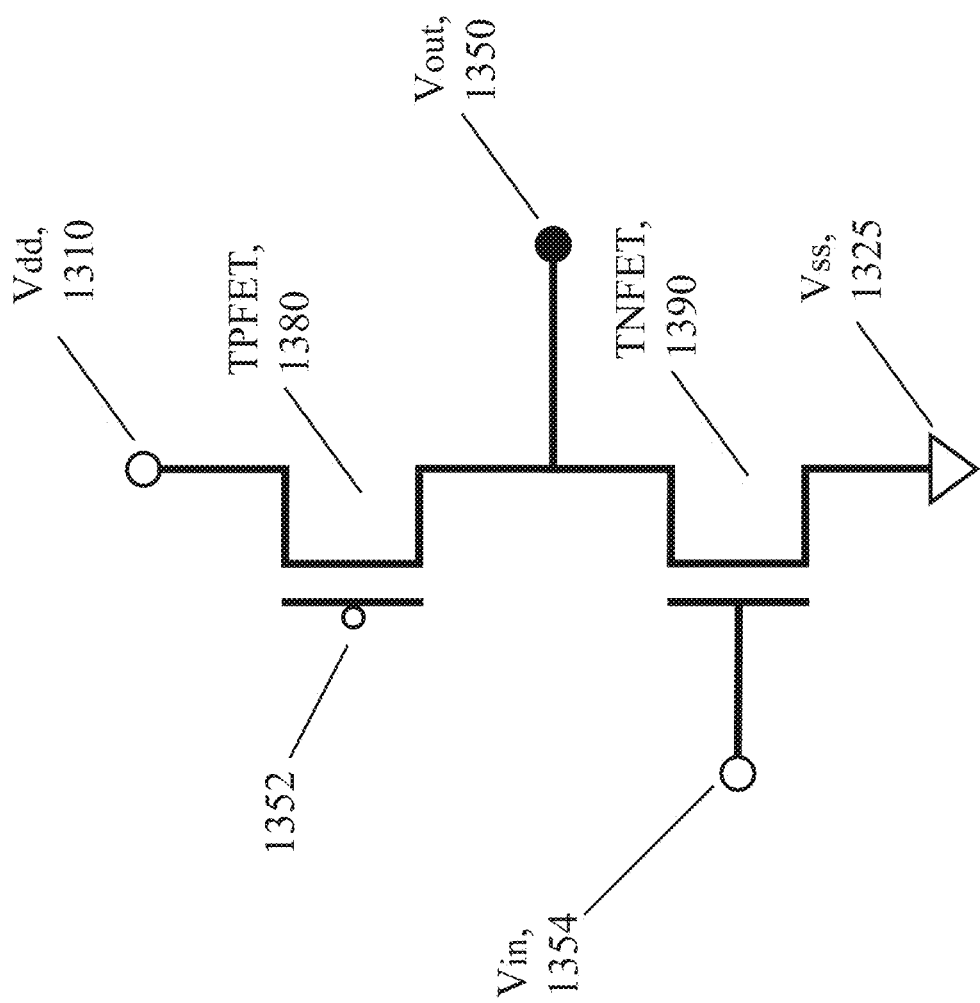
FIG. 13 is a circuit diagram of the stacked T-FET inverter device shown in FIG. 11.

FIG. 13 is a circuit diagram 1300 of the stacked T-FET inverter device 1100 shown in FIG. 11.

Again, the voltage input, $V_{in}$, 1354 is connected to the second gate (525, 551) external connection 950 of the second T-nFET (990, 1390), while the first gate (952, 1352)

of the first T-pFET 1380 floats without an external connection. The power supply terminal voltage, $V_{dd}$, 1310 is applied to the first source external connection (910, 1310) and the reference voltage, $V_{ss}$, is connected to the second source external connection (925, 1325).

In this embodiment, the external common drain connection (1150 and/or 1155, 1350) electrically connects to the internal common drain connection 625 and provides the output voltage, $V_{out}$, 1350 of the inverter device 1300.

In one embodiment, the inverter device 1300 behaves as a T-nFET 1390 switch with the T-pFET 1380 (with the floating gate 1352) acting as a resistor load. When $V_{in}$ 1354 is "low", off, or in the "0 state", $V_{out}$ 1350 will equal $V_{dd}$, or the "1 state". When $V_{in}$ 1354 is "high", on, or in the "1 state", $V_{out}$ 1350 will be tied to the $V_{ss}$ 1325 and will be in the "0 state".

Note that while the orientation (top and bottom) of the memory device (1100, 1300) appear inverted in FIGS. 11 and 13, the electrical connections are the same and correct for operation. The T-pFET 1380 and the T-nFET 1390 take nearly one half of the substrate area than similar planar circuits because the T-pFET 1380 and T-nFET 1390 are vertically stacked.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The terminology used herein was chosen to explain the principles of the embodiments and the practical application or technical improvement over technologies found in the marketplace or to otherwise enable others of ordinary skill in the art to understand the embodiments disclosed herein. Devices, components, elements, features, apparatus, systems, structures, techniques, and methods described with different terminology that perform substantially the same function, work in the substantial the same way, have substantially the same use, and/or perform the similar steps are contemplated as embodiments of this invention.

We claim:

1. A stacked vertical Tunneling Field Effect Transistor (VT-FET) structure comprising:
    a first T-FET comprising:
        a first source being heavily doped with a first source concentration of a first-source-type dopant;
        a first drain doped with a first drain concentration of a first-drain-type dopant, the first source and the first drain being oppositely doped;
        a first channel between the first source and first drain, the first channel disposed on the first source and the first drain disposed on the first channel in a vertical fin, the first channel having first channel sides, the first source having first source sides, and the first drain having first drain sides;
        a first gate stack having a first gate dielectric in physical and electrical contact with the first channel sides, a first drain overlap amount directly overlapping the first drain sides, and a first source overlap amount directly overlapping the first source sides, the first gate stack further having a first gate working metal in physical and electrical contact with the first gate dielectric;
    a second T-FET comprising:
        a second source being heavily doped with a second source concentration of a second-source-type dopant;
        a second drain doped with a second drain concentration of a second-drain-type dopant, the second source and the second drain being oppositely doped;
        a second channel between the second source and second drain, the second drain disposed on the first drain, the second channel disposed on the second drain, and the second source disposed on the second channel in the vertical fin, the second channel having second channel sides, the second source having second source sides, and the second drain having second drain sides;
        a second gate stack having a second gate dielectric in physical and electrical contact with the second channel sides, a second drain overlap amount directly overlapping the second drain sides, and a second source overlap amount directly overlapping the second source sides, the second gate stack further having a second gate working metal in physical and electrical contact with the second gate dielectric,
    wherein the first source, first channel, first drain, second drain, second channel, and second source are stacked in a fin, the fin perpendicular to a substrate.

2. A stacked VT-FET, as in claim 1, where the first source overlap amount is between 2 nanometers (nm) and 10 nm.

3. A stacked VT-FET, as in claim 1, where the first drain overlap amount is between 1 nm and 9 nm.

4. A stacked VT-FET, as in claim 1, where the first drain overlap is less than 60% the size of the first source overlap.

5. A stacked VT-FET, as in claim 1, where the first drain and second drain are electrically connected together internal to the VT-FET.

6. A stacked VTFET, as in claim 1, where the channel is one of: not doped and lightly doped with the drain-type dopant concentration between $5 \times 10^{17}$ cm$^{-3}$ and $1 \times 10^{19}$ cm$^{-3}$.

7. A stacked vertical Tunneling Field Effect Transistor (VT-FET) structure comprising:
    a first T-FET comprising:
        a first source being heavily doped with a first source concentration of a first-source-type dopant;
        a first drain doped with a first drain concentration of a first-drain-type dopant;
        a first channel between the first source and first drain, the first channel disposed on the first source and the first drain disposed on the first channel in a vertical fin, the first channel having first channel sides, the first source having first source sides, and the first drain having first drain sides;
        a first gate stack having a first gate dielectric in physical and electrical contact with the first channel sides, a first drain overlap amount directly overlapping the first drain sides, and a first source overlap amount directly overlapping the first source sides, the first gate stack further having a first gate working metal in physical and electrical contact with the first gate dielectric;
    a second T-FET comprising:
        a second source being heavily doped with a second source concentration of a second-source-type dopant;

a second drain doped with a second drain concentration of a second-drain-type dopant;

a second channel between the second source and second drain, the second drain disposed on the first drain, the second channel disposed on the second drain, and the second source disposed on the second channel in the vertical fin, the second channel having second channel sides, the second source having second source sides, and the second drain having second drain sides;

a second gate stack having a second gate dielectric in physical and electrical contact with the second channel sides, a second drain overlap amount directly overlapping the second drain sides, and a second source overlap amount directly overlapping the second source sides, the second gate stack further having a second gate working metal in physical and electrical contact with the second gate dielectric;

an external gate contact in physical and electrical contact with one of the first and second gate working metal, and an external first source contact in physical and electrical contact with the first source;

an external second source contact in physical and electrical contact with the second source; and the first and second drains being electrically connected with a common, internal connection by a conductive strap wherein, the first-source-type dopant and the first-drain-type dopant are dopants of different dopant types and the second-source-type dopant and the second-drain-type dopant are dopants of different dopant types.

8. A stacked VT-FET structure, as in claim 7, where the first drain concentration and second drain concentration are a dopant concentration between $1 \times 10^{19}$ cm$^{-3}$ and $1 \times 10^{20}$ cm$^{-3}$.

9. A stacked VT-FET structure, as in claim 7, is used as a memory device and the external gate contact is in physical and electrical contact with only one of the gate and the other gate is unconnected.

* * * * *